(12) United States Patent
Kim et al.

(10) Patent No.: US 8,310,891 B2
(45) Date of Patent: Nov. 13, 2012

(54) RESISTANCE VARIABLE MEMORY DEVICE FOR PROTECTING COUPLING NOISE

(75) Inventors: HoJung Kim, Gyeonggi-do (KR); Joon-Yong Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 419 days.

(21) Appl. No.: 12/574,227

(22) Filed: Oct. 6, 2009

(65) Prior Publication Data

US 2010/0103725 A1 Apr. 29, 2010

(30) Foreign Application Priority Data

Oct. 27, 2008 (KR) .................. 10-2008-0105399

(51) Int. Cl.
*G11C 7/00* (2006.01)

(52) U.S. Cl. ............... 365/203; 365/205; 365/189.08

(58) Field of Classification Search .......... 365/163, 365/148, 189.07, 189.08, 203, 205
See application file for complete search history.

(56) References Cited

U.S. PATENT DOCUMENTS

| 2007/0133271 A1* | 6/2007 | Cho et al. ................. 365/163 |
| 2009/0303785 A1* | 12/2009 | Hwang et al. ............. 365/163 |
| 2010/0124103 A1* | 5/2010 | Kim et al. ................. 365/163 |

FOREIGN PATENT DOCUMENTS

| KR | 1020050017475 A | 2/2005 |
| KR | 100587694 B1 | 6/2006 |
| KR | 1020080023582 A | 3/2008 |

* cited by examiner

*Primary Examiner* — Richard Elms
*Assistant Examiner* — Hien Nguyen
(74) *Attorney, Agent, or Firm* — Myers Bigel Sibley & Sajovec, P.A.

(57) ABSTRACT

The present invention relates to a resistance variable memory device, and more particularly, to a resistance variable memory device capable of preventing an effect of coupling noise. The resistance variable memory device includes: a memory cell connected to a bit line; a precharge circuit precharging the bit line in response to a precharge signal; a bias circuit providing a bias voltage to the bit line in response to a bias signal; and a control logic controlling the precharge signal and the bias signal. The control logic provides the bias signal to the bias circuit at a precharge interval. Accordingly, the resistance variable memory device according to the present invention can prevent an effect coupling noise.

13 Claims, 9 Drawing Sheets

Fig. 1

(PRIOR ART)

Fig. 2

(PRIOR ART)

Fig. 3

(PRIOR ART)

RESISTANCE VARIABLE MEMORY DEVICE FOR PROTECTING COUPLING NOISE

REFERENCE TO PRIORITY APPLICATION

This U.S. nonprovisional patent application claims priority to Korean Patent Application 10-2008-105399, filed Oct. 27, 2008, the contents of which are incorporated herein by reference.

FIELD OF THE INVENTION

The present invention relates to a resistance variable memory device, and more particularly, to a resistance variable memory device for preventing an effect of coupling noise.

BACKGROUND OF THE INVENTION

Semiconductor memory devices are storage devices that can store data and can output the stored data, if necessary. Generally, the semiconductor memory devices may be classified into Random Access Memories (RAMs) and Read-Only Memories (ROMs). The ROMs are a non-volatile memory that retains their stored data even when the power supply is interrupted. Examples of the ROMs include PROMs (Programmable ROMs), EPROMs (Erasable PROMs), EEPROMs (Electrically EPROMs), flash memories, and the like. The flash memories are classified into NOR-type flash memories and NAND-type flash memories. Meanwhile, the RAMs are a volatile memory that loses their stored data when the power supply is interrupted. Examples of the RAMs include Dynamic RAMs (DRAMs) and Static RAMs (SRAMs).

Recently, semiconductor memory devices in which non-volatile materials are substituted for the capacitor of the DRAM have been introduced. Examples of the semiconductor memory devices include ferroelectric RAMs (FRAMs) employing ferroelectric capacitors, magnetic RAMs (MRAMs) employing tunneling magneto-resistive (TMR) films, and phase change memory devices using chalcogenide alloys. Especially, the phase change memory devices are non-volatile memory devices using phase change, that is, resistance change according to temperature change. The phase change memory devices have a relatively simple manufacturing process and can realize capacious memory at a low cost.

The phase change memory device includes a write driver circuit supplying a program current to a phase change material (GST) during a programming operation. The write driver circuit supplies the program current such as a set current or reset current to memory cells by using power supply voltage (for example, 2.5V or more) provided from an external apparatus. The set current changes the phase change material (GST) of the memory cell into a set state, while the reset current changes the phase change material (GST) of the memory cell into a reset state.

SUMMARY

The present invention is directed to a resistance variable memory device capable of preventing an effect of coupling noise.

One aspect of the present invention is to provide a resistance variable memory device including: a memory cell connected to a bit line; a precharge circuit precharging the bit line in response to a precharge signal; a bias circuit providing a bias voltage to the bit line in response to a bias signal; and a control logic controlling the precharge signal and the bias signal. In this case, the control logic provides the bias signal to the bias circuit at a precharge interval.

According to one aspect of the present invention, the bias voltage may be applied to the bit line to read out the memory cell.

According to one aspect of the present invention, the precharge circuit may be configured by an NMOS transistor, and the NMOS transistor may be activated in response to the precharge signal at the precharge interval.

According to one aspect of the present invention, a voltage level of the precharge signal may be larger than a power supply voltage and smaller than the bias voltage so as to prevent a leakage current flowing from the bias circuit to the precharge circuit.

According to one aspect of the present invention, the precharge circuit may be configured by an NMOS transistor and a PMOS transistor connected to each other in parallel, and the NMOS transistor and the PMOS transistor may be activated in response to the precharge signal at the precharge interval.

According to one aspect of the present invention, a voltage level of the precharge signal may be larger than a power supply voltage and smaller than the bias voltage so as to prevent a leakage current flowing from the bias circuit to the precharge circuit.

According to one aspect of the present invention, the resistance variable memory device may further include a discharge circuit discharging initializing the bit line.

According to one aspect of the present invention, the resistance variable memory device may further include a sense amplifier comparing a voltage of the bit line with a reference voltage to output the compared result when the bias voltage is applied by the bias circuit.

According to one aspect of the present invention, the memory cell may include a storage element having a phase change material.

Another aspect of the present invention is to provide a portable electronic system including: a resistance variable memory device; and a central processing unit controlling the resistance variable memory device. The resistance variable memory device includes: a memory cell connected to a bit line; a precharge circuit precharging the bit line in response to a precharge signal; a bias circuit providing a bias voltage to the bit line in response to a bias signal; and a control logic controlling the precharge signal and the bias signal. Furthermore, the control logic provides the bias signal to the bias circuit at a precharge interval.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art.

Figure 1:
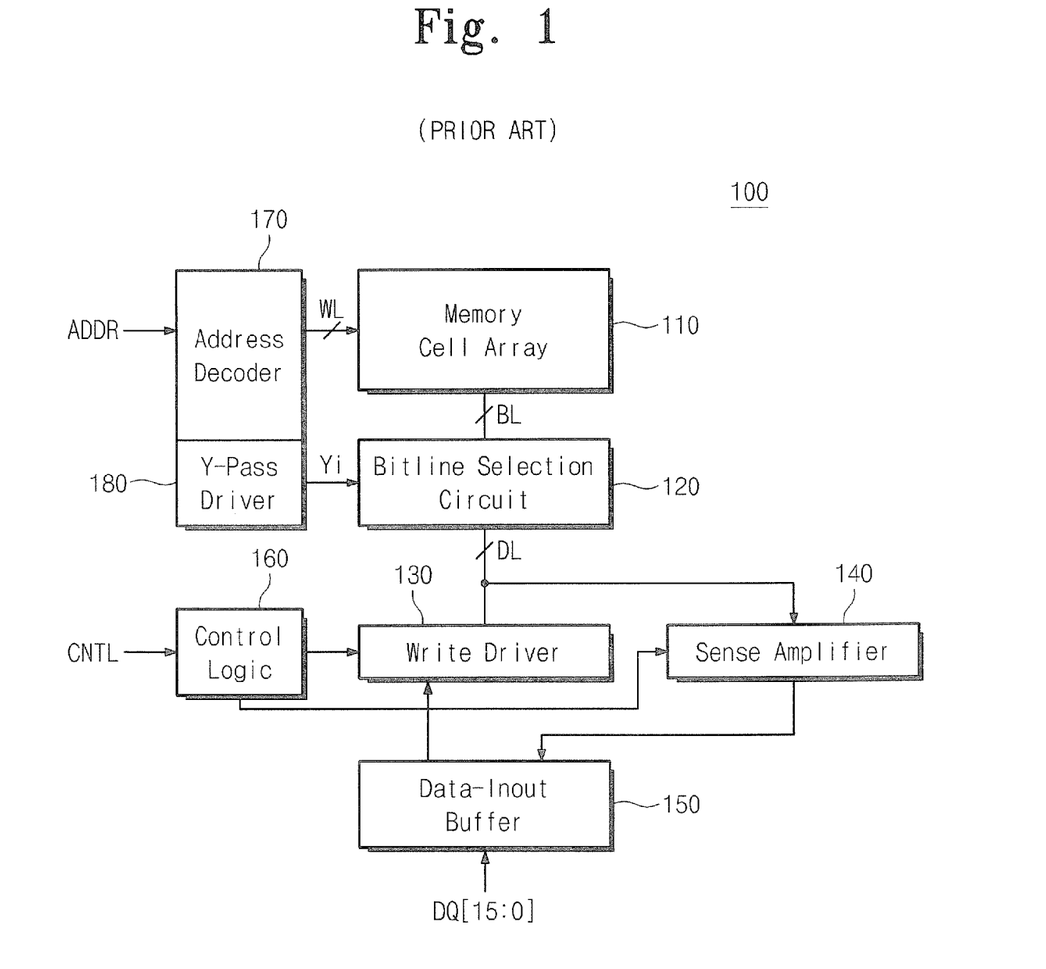
FIG. 1 is a block diagram of a general resistance variable memory device.

FIG. 1 is a block diagram of a general resistance variable memory device. Referring to FIG. 1, the resistance variable memory device 100 includes a memory cell array 110, a bit line selection circuit 120, a write driver 130, a sense amplifier 140, a data input and output buffer (data I/O buffer) 150, a control logic 160, an address decoder 170, and an Y-pass driver 180.

The memory cell array 110 may include a plurality of memory cells, and each memory cell may include a resistance variable memory element. Generally, the resistance variable memory element may include a phase change memory cell.

Each memory cell included in the memory cell array 110 may be configured by a memory element and a selection element. The memory element includes a phase change material such as GST (Ge—Sb—Te), and the selection element may be embodied by an NMOS transistor or a diode. The memory element includes the phase change material such as GST. The phase change material (GST) is a variable resistance element such as Ge—Sb—Te that varies in resistance according to a temperature. The phase change material (GST) takes either of two stable states, for example, a crystal state and an amorphous state according to the temperature. The phase change material (GST) is changed into the crystal state or the amorphous state based on currents supplied through a bit line BL. A phase change memory device programs data by using these characteristics of the phase change material (GST).

The address decoder 170 is connected to the memory cell array 110 through a word line WL. The address decoder 170 executes a decoding of an address ADDR input from an external apparatus and provides a bias current to a selected word line. In addition, the Y-pass driver 180 generates a selection signal Yi to select the bit line BL. The selection signal Yi is provided to the bit line selection circuit 120. The address decoder 170 receives an address ADDR to select the memory cell array 110 during a reading operation.

The bit line selection circuit 120 is connected to the memory cell array 110 through the bit line BL. The bit line selection circuit 120 selects a bit line BL of the memory cell array 110 in response to the selection signals Yi supplied from the Y-pass driver 180 during the reading operation and the programming operation. The bit line selection circuit 120 includes a plurality of NMOS transistors. The plurality of NMOS transistors connects electrically the bit line BL to a data line DL in response to the selection signal Yi.

The write driver 130 receives data DQ[15:0] from the data I/O buffer. Furthermore, the write driver 130 receives a program pulse from the control logic 160 and provides a program current to the data line DL. Here, the program pulse is provided by a program loop circuit (not shown) configured in the control logic 160 and includes a set pulse and a reset pulse. The program current includes a set current and a reset current. The write driver 130 provides the set current in response to the set pulse when data '0' is input and provides the reset current in response to the reset pulse when data '1' is input.

During a reading operation and a program verifying operation, the sense amplifier 140 reads out data stored in the memory cell and outputs the read data to the data I/O buffer 150. The sense amplifier 140 reads out the data stored in the memory cell during the program verifying operation to perform the program verifying operation. The control logic 160 controls the write driver 130 and the sense amplifier 140 so as to execute the reading operation and the program verifying operation in response to a control signal CNTL. The configuration and operation of the sense amplifier 140 will be described in detail with reference to FIGS. 2 and 3.

Figure 2:
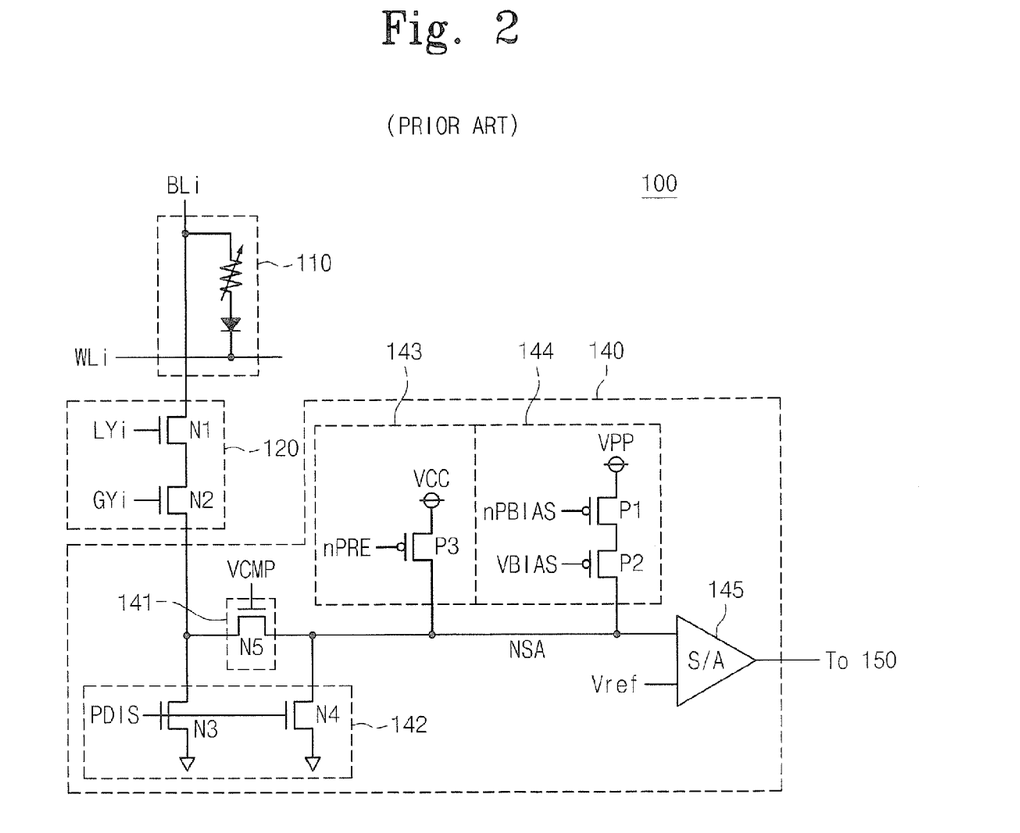
FIG. 2 is a circuit diagram illustrating more fully a sense amplifier illustrated in FIG. 1.

FIG. 2 is a circuit diagram illustrating in detail the sense amplifier illustrated in FIG. 1.

Referring to FIG. 2, the sense amplifier 140 includes a clamping circuit 141, a discharge circuit 142, a precharge circuit 143, a bias circuit 144, and a comparator 145.

The discharge circuit 142 initializes it by discharging a sensing node NSA to execute a correct sensing operation. The discharge circuit 142 is configured by two NMOS transistors N3 and N4.

The clamping circuit 141 clamps the data line DL to a predetermined voltage level during the reading operation and ultimately clamps a voltage level of a selected bit line BLi to a designated value. As illustrated in FIG. 2, the clamping circuit 141 is connected between the sensing node NSA and the data line DL. The clamping circuit 141 is configured by an NMOS transistor N5. The NMOS transistor N5 forms a current path between the sensing node NSA and the data line DL in response to a clamp voltage signal VCMP.

The clamp voltage signal VCMP is supplied from the control logic and has a constant DC voltage level during the reading operation. For example, the clamp voltage signal VCMP has a value obtained by adding a voltage of the bit line and a threshold voltage Vth of the NMOS transistor N5 to perform the reading operation. In order to perform the reading operation, assuming that the voltage of the bit line is 1V and the threshold voltage Vth of the NMOS transistor N5 is 0.5V, the clamp voltage signal VCMP has 1.5V DC voltage. The clamp voltage signal VCMP may generated by an internal voltage generator (not shown) insensitive to PVT (Process-Voltage-Temperature) variation. In FIG. 1, the control logic 160 includes the internal voltage generator.

The precharge circuit 143 precharges the sensing node NSA with a power supply voltage VCC before a sensing operation of the sense amplifier 140 and precharges the selected bit line BLi with a clamping voltage at the same time. Referring to FIG. 2, the precharge circuit 143 is connected between the sensing node NSA and a power supply terminal. The precharge circuit 143 receives the power supply voltage VCC through the power supply terminal during the reading operation. The precharge circuit 143 is configured by a PMOS transistor P3. The PMOS transistor P3 precharges the sensing node NSA with the power supply voltage VCC and precharges the selected bit line BLi with the clamping voltage, in response to a precharge signal nPRE. The precharge signal nPRE is supplied from the control logic 160.

The bias circuit 144 supplies a read current to the selected bit line BLi during the reading operation. Referring to FIG. 2, the bias circuit 144 is connected between the sensing node NSA and the power supply terminal. The bias circuit 144 receives a boosted voltage VPP through the power supply terminal during the reading operation. The bias circuit 144 is configured such that two PMOS transistors P1 and P2 are connected to each other in series.

The first PMOS transistor P1 supplies the boosted voltage VPP to the second PMOS transistor P2 in response to an nPBIAS signal. The second PMOS transistor P2 supplies the read current to the selected bit line BLi in response to a bias voltage signal VBIAS. The bias voltage current VBIAS is supplied from the control logic 160 and has a predetermined DC voltage during the reading operation.

The comparator 145 senses difference between the sensing node NSA voltage and a reference voltage Vref during the reading operation to provide a sensing result to the data I/O buffer 150. Here, the reference voltage Vref is supplied from a reference voltage generator (not shown). The sense amplifier 140 receives control signals from the control logic 160 during the reading operation and receives the boosted voltage VPP from a booster (not shown).

The control logic 160 outputs control signals in response to a command CMD supplied from an external source to control the clamping circuit 141, the discharge circuit 142, the precharge circuit 143, and the bias circuit 144.

Figure 3:
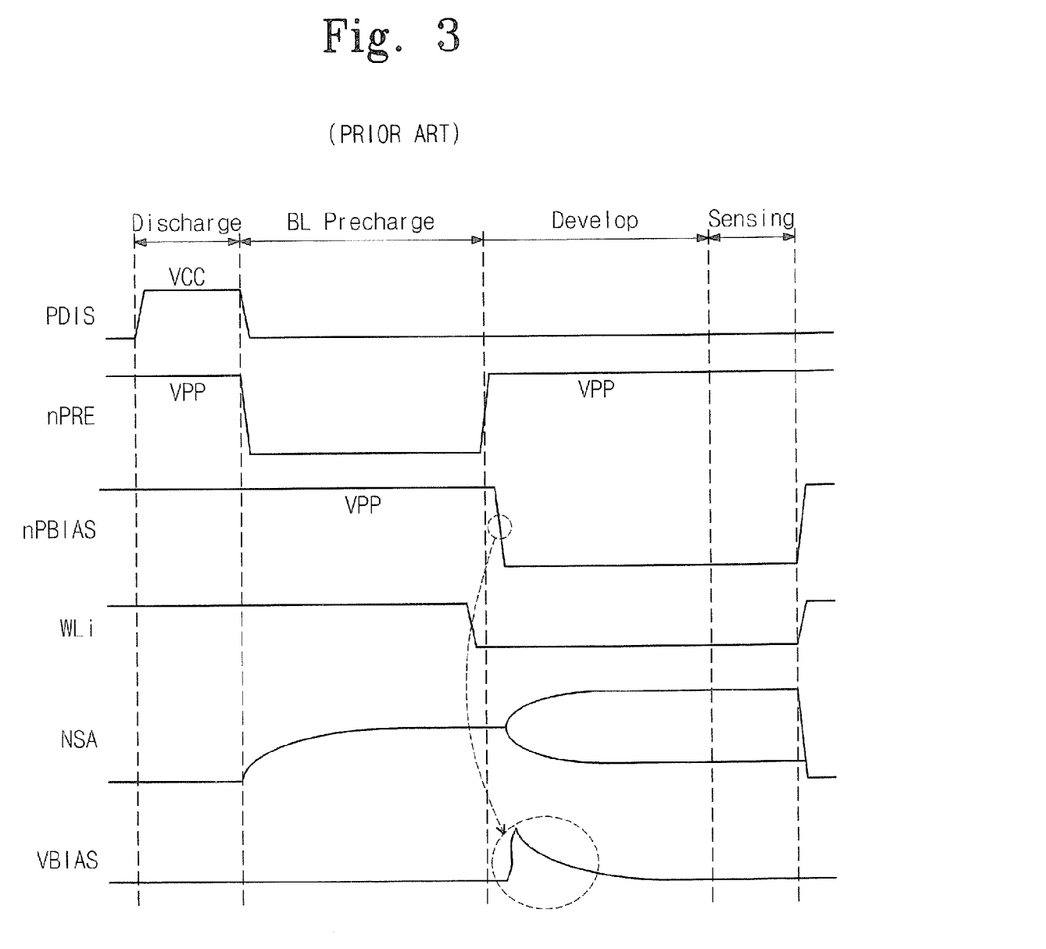
FIG. 3 is a timing diagram explaining a reading operation of the sense amplifier illustrated in FIG. 1.

FIG. 3 is a timing diagram explaining a reading operation of the sense amplifier 140 illustrated in FIG. 2. For convenience of description, the operation of the resistance variable memory device 100 will be described with respect to a discharge interval, a bit line BL precharge interval, a develop interval, and a sensing interval.

First, the operation of the resistance variable memory device 100 will be described with respect to the discharge interval. Referring to FIGS. 1 to 3, the word line WLi maintains a high level, but the bit line BLi maintains a low level depending on the discharge circuit 142. Since the precharge signal nPRE maintains a high level, the precharge transistor P3 maintains a turn-off state. Since the bias voltage signal VBIAS is maintained at a constant DC voltage, for example, a voltage that is lower than the power supply voltage VCC and higher than a ground voltage GND to supply the read current required for the reading operation, the sensing node NSA maintains a boosted voltage level VPP higher than the power supply voltage VCC.

Next, the operation of the resistance variable memory device 100 will be described with respect to the bit line BL precharge interval. Referring FIGS. 1 to 3, since the precharge signal nPRE maintains a low level, the precharge transistor P3 is turned on and the sensing node NSA maintains the power supply voltage VCC. When the voltage of 1V is supplied to the bit line so as to perform the reading operation, since the clamp voltage signal VCMP is maintained at the constant DC voltage, for example, the voltage obtained by adding the threshold voltage of the clamping transistor N5 to the voltage of 1V, the data line DL and the bit line BLi rise to approximately 1V.

Next, the operation of the resistance variable memory device 100 will be described with respect to the develop interval. Referring FIGS. 1 to 3, since the precharge signal nPRE maintains a high level, the precharge transistor P3 is turned off. Since the bias voltage signal VBIAS maintains a constant DC voltage, the bias circuit 144 supplies successively the read current to the selected memory cell. As nPBIAS signal is activated, the bias voltage signal VBIAS is affected by a coupling noise.

Since the clamp voltage signal VCMP successively maintains a constant DC voltage and the selected word line WLi maintains a ground voltage, the sensing node NSA changes according to a cell state of the selected memory cell, that is, a set or reset state, as illustrated in FIG. 3.

As illustrated in FIG. 3, when the selected memory cell is in the set state, the voltage of the sensing node NSA never drops to the ground voltage GND due to the threshold voltage of the diode in the selected memory cell. However, as illustrated in FIG. 3, when the selected memory cell is in the reset state, the voltage of the sensing node NSA maintains the boosted voltage VPP to obtain a sufficient sensing margin. In this case, the reading operation is performed more efficiently. Preferably, the boosted voltage VPP may have the value obtained by adding the threshold voltage of the diode in the selected memory cell configuring the memory cell array 110 to the power supply voltage VCC.

In the course of transition from the precharge interval to the develop interval, the coupling noise is generated in the VBIAS signal due to the activation of the nPBIAS signal. For example, when the sense amplifier connected to 128 bit lines is simultaneously operated, as illustrated in FIG. 3, the bias voltage signal VBIAS rises temporarily at the develop interval due to the activation of the nPBIAS signal. This affects a sensing speed (that is, reading operation time) of the resistance variable memory device 100. In addition, the coupling noise changes the bias voltage signal VBIAS during a resistance scattering measurement of the resistance variable memory cell, thereby affecting a reading margin. Accordingly, since the operation of the sense amplifier 140 waits until the VBIAS signal is stabilized at the develop interval, the develop interval should be maintained for a long time.

The resistance variable memory device according to the embodiment of the present invention removes the coupling noise by activating the nPBIAS signal in the precharge operation. Specifically, the resistance variable memory device according to the embodiment of the present invention will be described more fully with reference to FIGS. 4 to 8.

Figure 4:
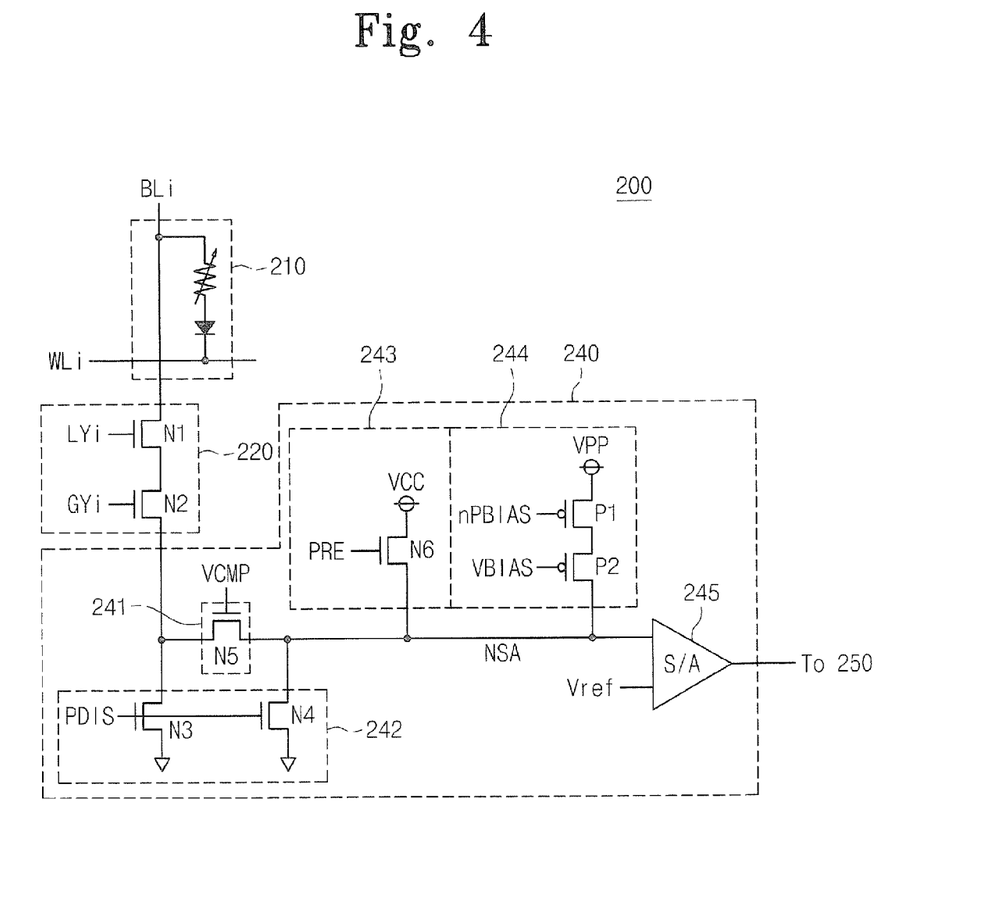
FIG. 4 is a circuit diagram of a resistance variable memory device according to a first embodiment of the present invention.
Figure 5:
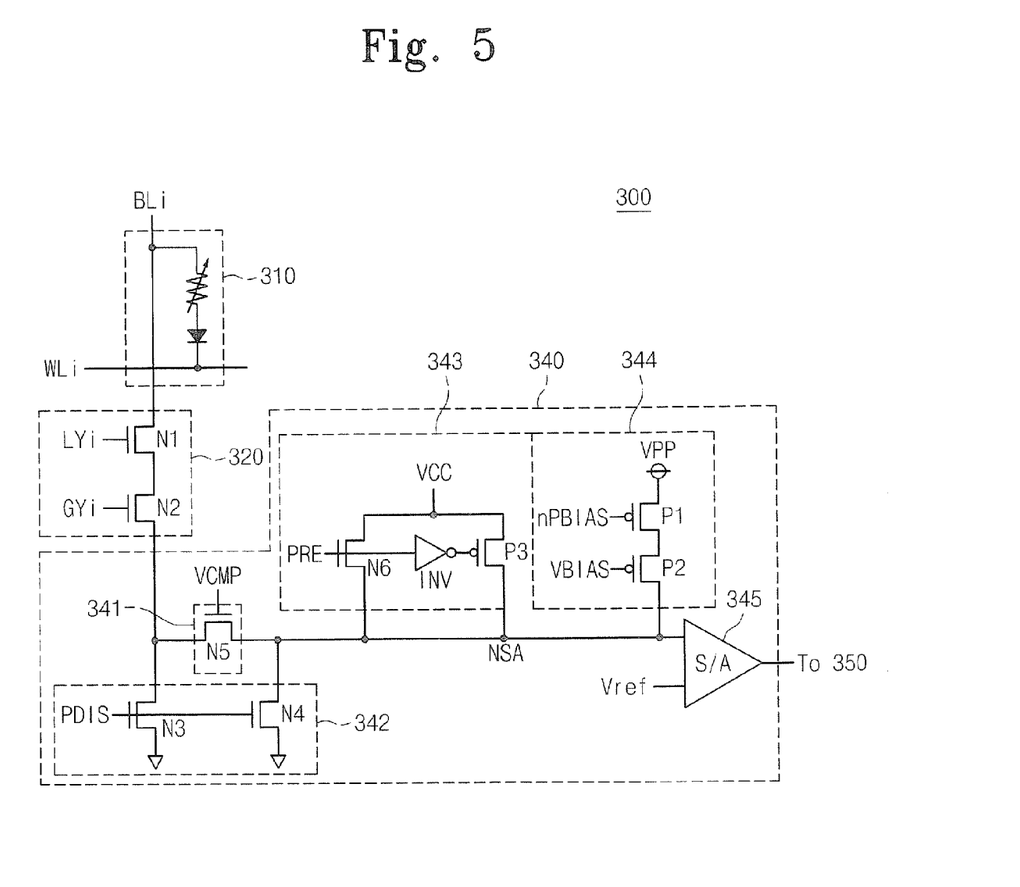
FIG. 5 is a circuit diagram of a resistance variable memory device according to a second embodiment of the present invention.

FIG. 4 is a circuit diagram of a resistance variable memory device according to a first embodiment of the present invention, and FIG. 5 is a circuit diagram of a resistance variable memory device according to a second embodiment of the present invention. The resistance variable memory device of FIGS. 4 and 5 are the same as that of FIG. 2 except for the precharge circuit. Therefore, the duplicated description will be omitted.

Referring to FIG. 4, the resistance variable memory device 200 includes a memory cell array 210, a bit line selection circuit 220, a sense amplifier 240, and a data input and output buffer (data I/O buffer) 250. Furthermore, the resistance variable memory device 200 may further include a write driver, a control logic, an address decoder, and an Y-pass driver, even though not illustrated in FIG. 4.

The sense amplifier 240 includes a clamping circuit 241, a discharge circuit 242, a precharge circuit 243, a bias circuit 244, and a comparator 245.

The precharge circuit 243 precharges the sensing node NSA with a power supply voltage VCC before a sensing operation of the sense amplifier 240 and precharges the selected bit line BLi with a clamping voltage at the same time.

Subsequently, referring to FIG. 4, the precharge circuit 243 is connected between the sensing node NSA and a power supply terminal. The precharge circuit 243 receives the power supply voltage VCC through the power supply terminal during the reading operation. The precharge circuit 243 is configured by an NMOS transistor N6. The NMOS transistor N6 precharges the sensing node NSA with the power supply voltage VCC and precharges the selected bit line BLi with the clamping voltage, in response to a precharge signal PRE. The precharge signal PRE is supplied from the control logic.

Referring to FIG. 5, the resistance variable memory device 300 includes a memory cell array 310, a bit line selection circuit 320, a sense amplifier 340, and a data input and output buffer (data I/O buffer) 350. Furthermore, the resistance variable memory device 300 may further include a write driver, a control logic, an address decoder, and an Y-pass driver, even though not illustrated in FIG. 5.

The sense amplifier 340 includes a clamping circuit 341, a discharge circuit 342, a precharge circuit 343, a bias circuit 344, and a comparator 345.

The precharge circuit 343 precharges the sensing node NSA with a power supply voltage VCC before a sensing operation of the sense amplifier 340 and precharges the selected bit line BLi with a clamping voltage at the same time.

Subsequently, referring to FIG. 5, the precharge circuit 343 is connected between the sensing node NSA and a power supply terminal. The precharge circuit 343 receives the power supply voltage VCC through the power supply terminal during the reading operation. The precharge circuit 343 is configured by an NMOS transistor N6 and a PMOS transistor P3 connected to each other in parallel. A precharge signal PRE is input to a gate terminal of the NMOS transistor N6, and an output signal of an inverter is input to a gate terminal of the PMOS transistor P3. Here, the inverter receives the precharge signal PRE.

The precharge circuit 343 precharges the sensing node NSA with the power supply voltage VCC and precharges the selected bit line BLi with the clamping voltage, in response to the precharge signal PRE. The precharge signal PRE is supplied from the control logic.

The reading operation of the resistance variable memory device illustrated in FIGS. 4 and 5 will be described more fully with reference to FIG. 6.

Figure 6:
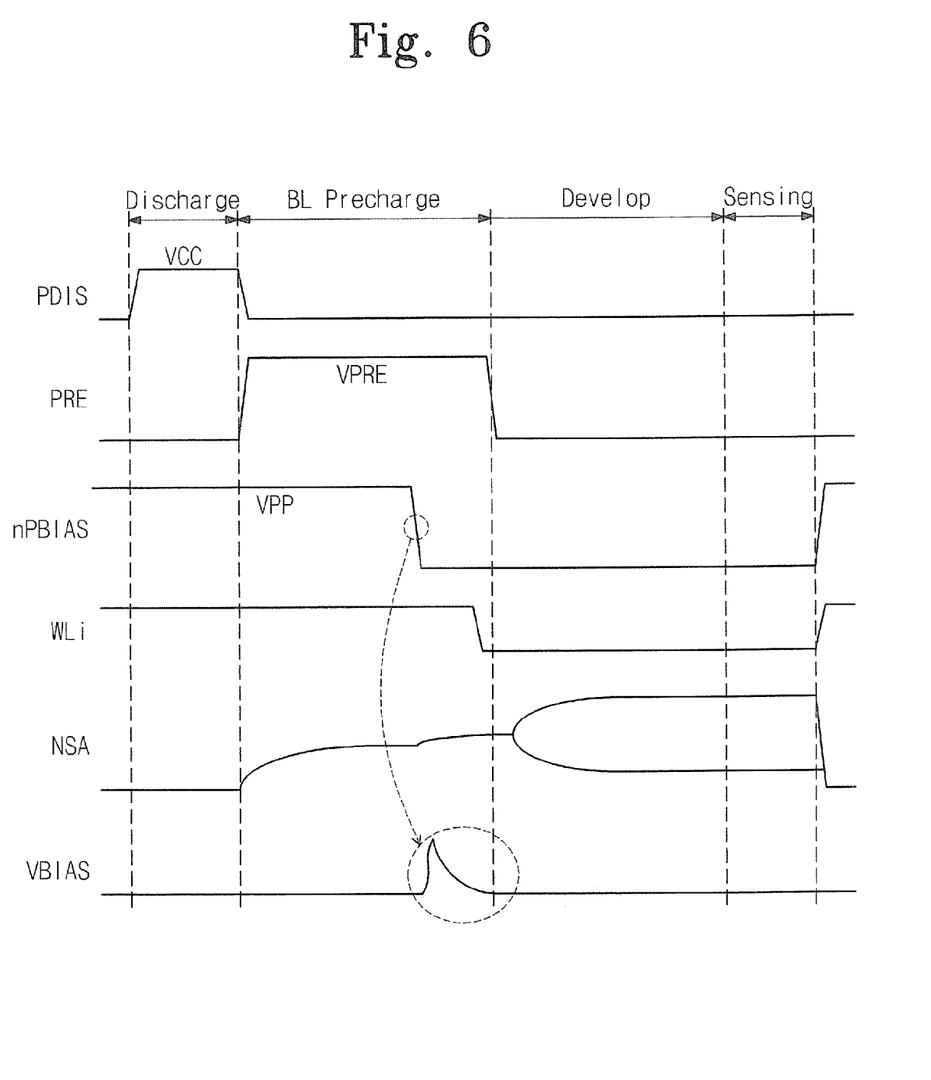
FIG. 6 is a timing diagram explaining a reading operation of the resistance variable memory device illustrated in FIGS. 4 and 5.

FIG. 6 is a timing diagram explaining the reading operation of the resistance variable memory device illustrated in FIGS. 4 and 5. The reading operation of FIG. 4 is equal to that of FIG. 5. Therefore, the reading operation of FIG. 5 may be substituted by the reading operation of FIG. 4.

For convenience of description, the operation of the resistance variable memory device 200 will be described with respect to a discharge interval, a bit line BL precharge interval, a develop interval, and a sensing interval.

First, the operation of the resistance variable memory device 200 will be described with respect to the discharge interval. Referring to FIGS. 4 to 6, the word line WLi maintains a high level, but the bit line BLi maintains a low level depending on the discharge circuit 142. Since the precharge signal PRE maintains a low level, the precharge transistor N6 maintains a turn-off state. Since the bias voltage signal VBIAS is maintained at a constant DC voltage, for example, a voltage that is lower than the power supply voltage VCC and higher than a ground voltage GND to supply the read current required for the reading operation, the sensing node NSA maintains a boosted voltage level higher than the power supply voltage VCC.

Next, the operation of the resistance variable memory device 200 will be described with respect to the bit line BL precharge interval. Referring FIGS. 4 to 6, since the precharge signal PRE maintains a high level, the precharge transistor N6 is turned on and the sensing node NSA maintains the power supply voltage VCC. When the voltage of 1V is supplied to the bit line so as to perform the reading operation, since the clamp voltage signal VCMP is maintained at the constant DC voltage, for example, the voltage obtained by adding the threshold voltage of the clamping transistor N5 to the voltage of 1V, the data line DL and the bit line BLi rise to approximately 1V.

As the nPBIAS signal is activated, the bias voltage signal VBIAS is affected by the coupling noise. However, the bias voltage signal VBIAS is stabilized in the develop operation.

Next, the operation of the resistance variable memory device 200 will be described with respect to the develop interval. Referring FIGS. 4 to 6, since the precharge signal PRE maintains a low level, the precharge transistor N6 is turned off. Since the bias voltage signal VBIAS maintains a constant DC voltage, the bias circuit 144 supplies successively the read current to the selected memory cell. Since the clamp voltage signal VCMP successively maintains a constant DC voltage and the selected word line WLi maintains a ground voltage, the sensing node NSA changes according to a cell state of the selected memory cell, that is, a set or reset state, as illustrated in FIG. 3.

Figure 7:
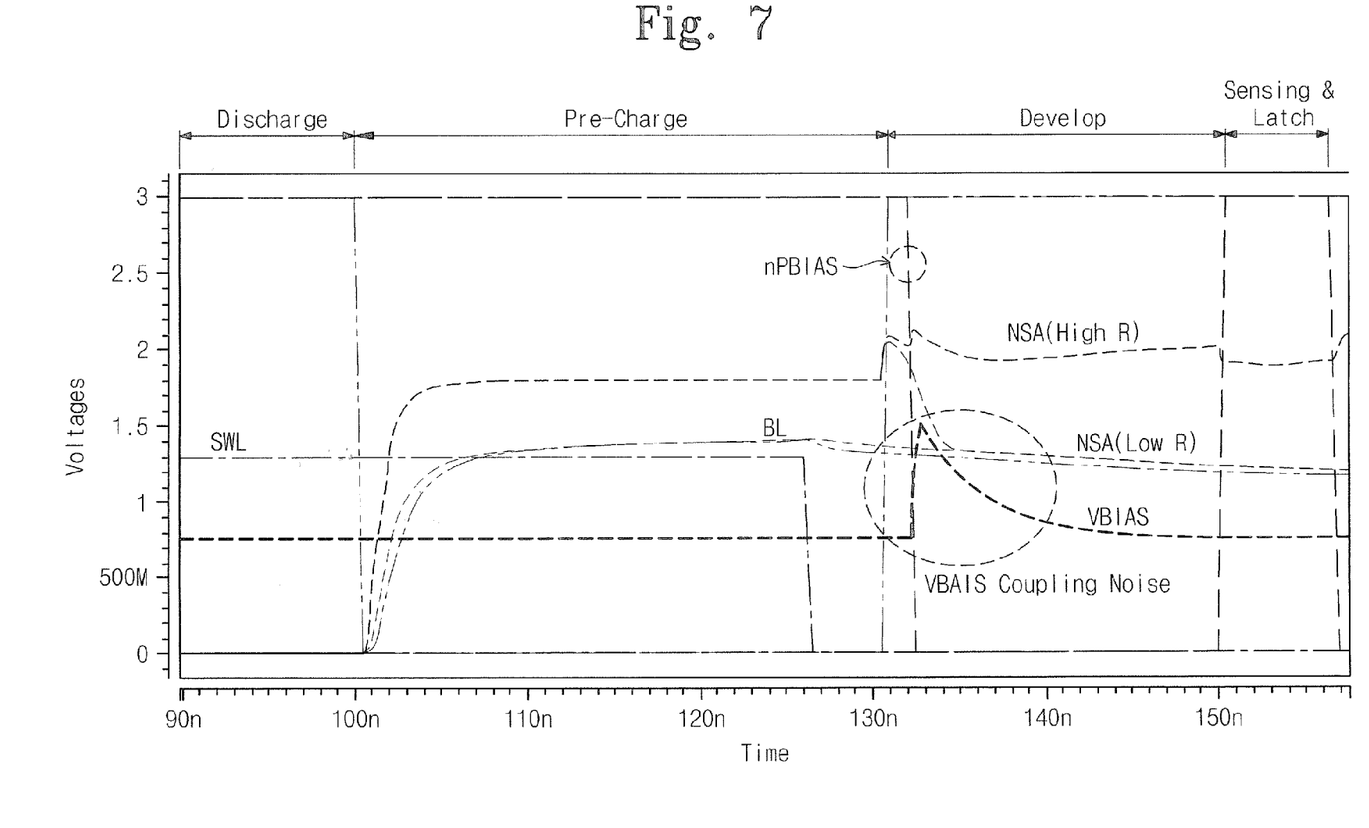
FIG. 7 is a diagram illustrating simulation result of the sense amplifier illustrated in FIG. 2.
Figure 8:
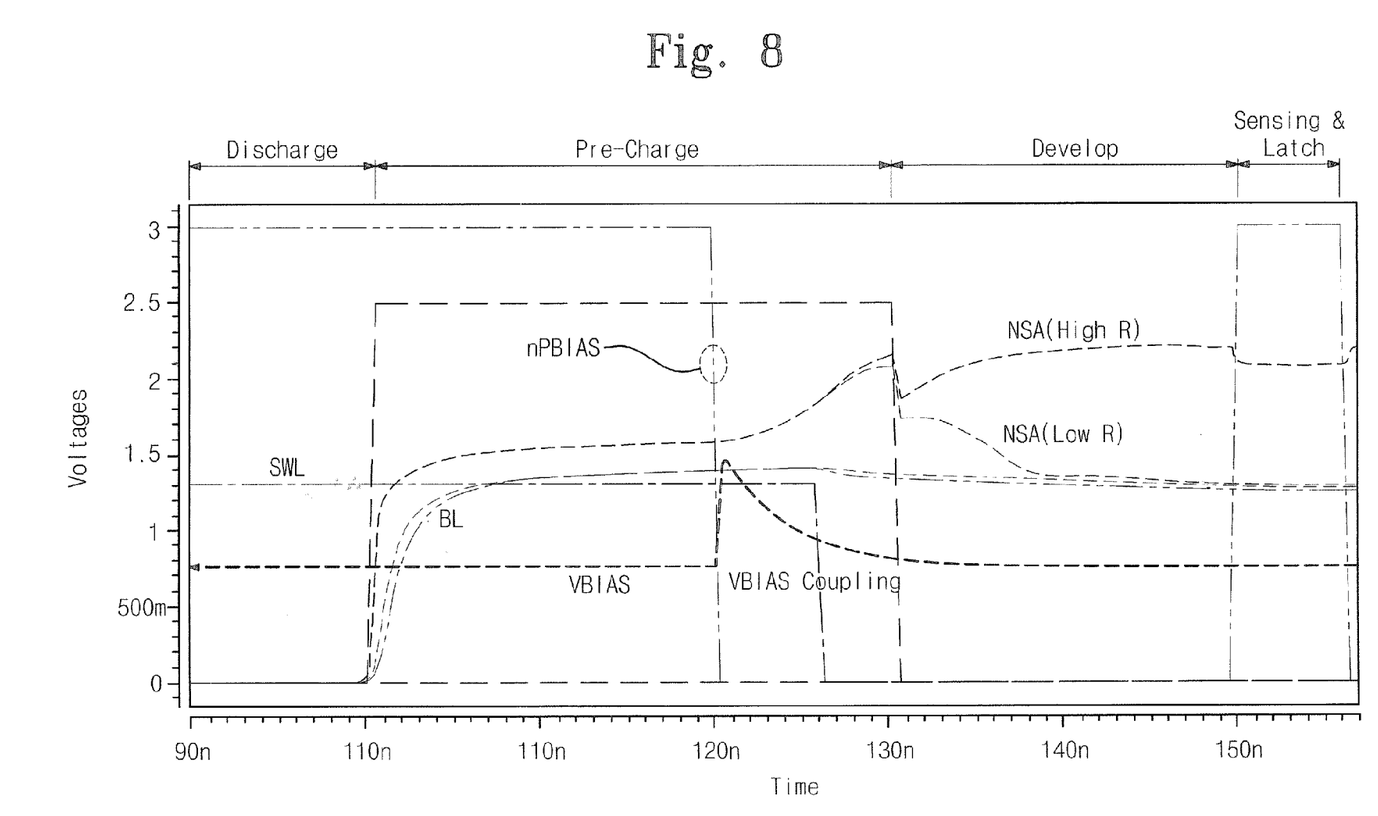
FIG. 8 is a diagram illustrating simulation result of the sense amplifier illustrated in FIGS. 4 and 5.

As illustrated in FIG. 6, when the selected memory cell is in the set state, the voltage of the sensing node NSA never drops to the ground voltage GND due to the threshold voltage of the diode in the selected memory cell. However, as illustrated in FIG. 6, when the selected memory cell is in the reset state, the voltage of the sensing node NSA maintains the boosted voltage VPP to obtain a sufficient sensing margin. In this case, the reading operation is performed more efficiently. Preferably, the boosted voltage VPP may have the value obtained by adding the threshold voltage of the diode in the selected memory cell configuring the memory cell array 210 to the power supply voltage VCC. FIGS. 7 and 8 illustrate results of really simulating the timing diagrams illustrated in FIGS. 3 and 6.

The resistance variable memory device according to the first embodiment of the present invention applies the bias voltage during the precharge operation. In this case, since the coupling noise occurs in the precharge operation, the resistance variable memory device is not affected in the develop operation.

Furthermore, the precharge circuit according to the first embodiment of the present invention is configured by the NMOS transistor, and the precharge circuit according to the second embodiment of the present invention is configured by the NMOS transistor and the PMOS transistor connected to each other in parallel. This prevents the current from flowing to the power supply voltage VCC of the precharge circuit 243 from the boosted voltage VPP of the bias circuit 244. That is, in order to prevent the current from flowing to the precharge circuit 243 from the bias circuit 244, the voltage level of the precharge signal is set to be smaller than the sum of the power supply voltage and the threshold voltage. For example, if the voltage level of the precharge signal PRE is set to be smaller than the sum of the power supply voltage and the threshold voltage, the NMOS transistor N6 of the precharge circuit 243 may be interrupted. Accordingly, the current is prevented from flowing to the precharge circuit 243 from the bias circuit 244.

FIG. 7 is a diagram illustrating simulation result of the sense amplifier illustrated in FIG. 2, and FIG. 8 is a diagram illustrating simulation result of the sense amplifier illustrated in FIGS. 4 and 5.

As illustrated in FIG. 7, the bias voltage VBIAS leaps due to the coupling noise during the develop operation.

As illustrated in FIG. 8, the bias voltage VBIAS leaps due to the coupling noise during the precharge operation. Therefore, the bias voltage VBIAS is not affected by the coupling noise during the develop operation.

Figure 9:
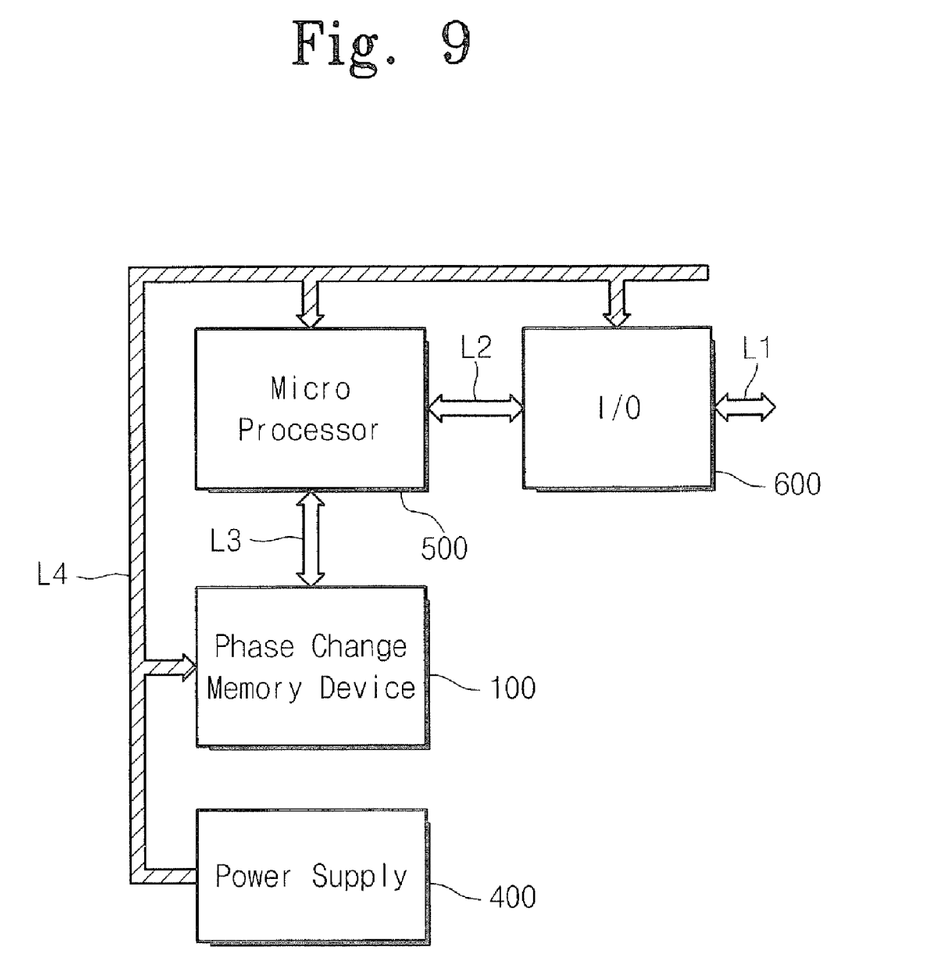
FIG. 9 is a block diagram of a portable electronic system embodying the resistance variable memory devices according to the embodiments of the present invention.

FIG. 9 is a block diagram of a portable electronic system embodying the resistance variable memory devices according to the embodiments of the present invention. An example of the resistance variable memory device according to the embodiments of the present invention may include a phase change memory device.

The resistance variable memory device 100 is connected to a microprocessor 500 through a bus line L3 and functions as a main memory of a portable electronic system. A battery 400 supplies power supply to the microprocessor 500, I/O device 600, resistance variable memory device 100 through a power supply line L4.

When the received data is provided to the I/O device 600 through a line L1, the microprocessor 500 receives and processes the received data through a line L2 and then applies the received or processed data to the resistance variable memory device 100 through the bus line L3. The resistance variable memory device 100 stores the data applied through the bus line L3 in the memory cell. In addition, the data stored in the memory cell is read out by means of the microprocessor 500, and the read data is output to an external apparatus through the I/O device 600.

Even when the power supply of the battery 400 is not supplied to the power supply line L4, the data stored in the memory cell of the resistance variable memory device 100 is not lost due to the characteristics of the phase change materials. This is because the resistance variable memory device 100 is a non-volatile memory device unlike DRAM. Besides, the resistance variable memory device 100 has a fast operation speed and small power consumption compared to other memory devices.

The resistance variable memory device according to the embodiments of the present invention can prevent the effect of coupling noise.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. An integrated circuit memory device, comprising:
a memory cell electrically coupled to a bit line;
a sense amplifier electrically coupled to the bit line during an operation to read data from the memory cell, the sense amplifier comprising:
a precharge circuit configured to precharge the bit line to a precharged voltage level in response to a precharge signal that is active during a precharge time interval and inactive during a develop time interval that commences upon termination of the precharge time interval;
a comparator having a first input terminal electrically coupled to the bit line during the precharge and develop time intervals; and
a bias circuit electrically coupled to the first input terminal, the bias circuit comprising a pair of pull-up transistors electrically connected in series between the first input terminal and a reference voltage line, the pair of pull-up transistors comprising:
a first pull-up transistor responsive to a first bias voltage that is held at a constant voltage level during the precharge and develop time intervals; and
a second pull-up transistor responsive to a second bias voltage that is switched from an inactive level to an active level during the precharge time interval and held at the active level during the develop time interval so that the first and second pull-up transistors operate collectively to supply a pull-up current to the first input terminal during a portion of the precharge time interval and during the develop time interval.

2. The memory device of claim 1, wherein the precharge circuit comprises an NMOS pull-up transistor having a source terminal electrically connected to the first input terminal.

3. The memory device of claim 2, wherein the NMOS pull-up transistor has a drain terminal electrically connected to a power supply line.

4. The memory device of claim 1, further comprising an NMOS clamping transistor having a first current carrying terminal electrically connected to the first input terminal, a second current carrying terminal electrically coupled to the bit line during the operation to read data from the memory cell and a gate terminal responsive to a clamping voltage that is active during the precharge and develop time intervals.

5. A resistance variable memory device comprising:
a memory cell connected to a bit line;
a precharge circuit precharging the bit line in response to a precharge signal;
a bias circuit providing a bias voltage to the bit line in response to a bias signal; and
a control logic controlling the precharge signal and the bias signal,
wherein the control logic provides the bias signal to the bias circuit at a precharge interval;
wherein said precharge circuit is configured by a power supply terminal receiving a power supply voltage and an NMOS transistor and a PMOS transistor connected in parallel to the power supply terminal; and
wherein the NMOS transistor and the PMOS transistor are activated in response to the precharge signal at the precharge interval.

6. The resistance variable memory device as set forth in claim 5, wherein the bias voltage is applied to the bit line to read out the memory cell.

7. The resistance variable memory device as set forth in claim 5, wherein a voltage level of the precharge signal is smaller than the sum of a power supply voltage and a threshold voltage of the NMOS transistor so as to prevent current from flowing to the precharge circuit from the bias circuit.

8. The resistance variable memory device as set forth in claim 5, further comprising a discharge circuit discharging and initializing the bit line.

9. The resistance variable memory device as set forth in claim 5, further comprising a sense amplifier comparing a voltage of the bit line with a reference voltage to output the compared result when the bias voltage is applied by the bias circuit.

10. The resistance variable memory device as set forth in claim 5, wherein the memory cell includes a storage element having a phase change material.

11. A memory device comprising:
a variable resistance memory cell connected to a bit line;
a precharge circuit configured to precharge the bit line in response to a precharge signal;
a bias circuit configured to provide a bias current to the bit line in response to a transition of a bias signal from an inactive state to an active state; and
a control circuit configured to generate the precharge and bias signals, said control logic configured to switch the precharge signal to an active level during a precharge time interval and switch the bias signal from an inactive level to an active level at an intermediate point within the precharge time interval so that both the precharge signal and bias signal remain concurrently active from the intermediate point until a termination of the precharge time interval when the precharge signal switches to an inactive level.

12. The memory device of claim 11, wherein said control circuit maintains the bias signal at its active level through termination of the precharge time interval.

13. The memory device of claim 12, further comprising a word line electrically coupled to said variable resistance memory cell; and wherein said control circuit supports a memory cell reading operation by driving the word line an active level during a data sensing time interval while the bias signal remains at its active level.

* * * * *